(12) United States Patent
Birru

(10) Patent No.: US 7,944,988 B2
(45) Date of Patent: May 17, 2011

(54) CONFIGURATION FOR IMPLEMENTING ENHANCED VSB ON THE STUDIO SIDE

(75) Inventor: Dagnachew Birru, Yorktown Heights, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 1718 days.

(21) Appl. No.: 10/533,711

(22) PCT Filed: Oct. 27, 2003

(86) PCT No.: PCT/IB03/04776
§ 371 (c)(1),
(2), (4) Date: May 3, 2005

(87) PCT Pub. No.: WO2004/043073
PCT Pub. Date: May 21, 2004

(65) Prior Publication Data
US 2005/0271158 A1    Dec. 8, 2005

Related U.S. Application Data

(60) Provisional application No. 60/423,616, filed on Nov. 4, 2002, provisional application No. 60/482,952, filed on Jun. 27, 2003.

(51) Int. Cl.
*H04L 27/02* (2006.01)
(52) U.S. Cl. .......................... 375/270; 375/240
(58) Field of Classification Search ............ 375/270, 375/240, 265, 301, 300; 348/614, 21, 495, 348/462; 370/535; 714/792
See application file for complete search history.

(56) References Cited

U.S. PATENT DOCUMENTS

| | | | | |
|---|---|---|---|---|
| 5,884,064 A * | 3/1999 | Rosenberg | ................. | 370/395.3 |
| 6,278,685 B1 * | 8/2001 | Yonge et al. | ................... | 370/203 |
| 6,591,391 B1 * | 7/2003 | Rowenhorst et al. | ......... | 714/756 |
| 6,760,077 B2 * | 7/2004 | Choi et al. | ..................... | 348/614 |
| 6,810,090 B1 * | 10/2004 | Perlow | .......................... | 375/301 |
| 7,111,221 B2 * | 9/2006 | Birru et al. | ..................... | 714/755 |
| 7,194,047 B2 * | 3/2007 | Strolle et al. | .................. | 375/341 |
| 7,430,251 B2 * | 9/2008 | Choi et al. | ..................... | 375/301 |
| 7,450,613 B2 * | 11/2008 | Choi et al. | ..................... | 370/486 |
| 2002/0001349 A1 * | 1/2002 | Bretl et al. | ............... | 375/240.26 |
| 2002/0126222 A1 | 9/2002 | Choi | | |
| 2002/0186780 A1 | 12/2002 | Choi | | |
| 2002/0186790 A1 * | 12/2002 | Choi et al. | ..................... | 375/321 |
| 2004/0028076 A1 * | 2/2004 | Strolle et al. | .................. | 370/466 |
| 2004/0057535 A1 * | 3/2004 | Strolle et al. | .................. | 375/340 |

OTHER PUBLICATIONS

ATSC Standard Digital Television Standard, Revision B, with Amendment 1 Annex C: Service Multiplex and transport System Characteristics (Normative). Aug. 7, 2001, p. 41-80.

* cited by examiner

*Primary Examiner* — Shuwang Liu
*Assistant Examiner* — Helene Tayong

(57) ABSTRACT

Enhancements allowing multiplexing of normal and robust data in wireless digital video transmissions using vestigial sideband modulation are implemented as an enhanced vestigial sideband encoder on the studio side and a standard vestigial sideband modulator at the transmitter. The enhanced encoder conventionally processes multiplexed data into encoded packets, with backwards compatible parity data supplied for normal data, then deinterleaves the processed data, removes a trailing portion from each packet, and derandomizes the remainder before forwarding the processed encoded data as MPEG compliant packets to the standard modulator for VSB modulation and transmission.

20 Claims, 4 Drawing Sheets

US 7,944,988 B2

CONFIGURATION FOR IMPLEMENTING ENHANCED VSB ON THE STUDIO SIDE

This application claims the benefit of the filing date of provisional U.S. patent application Ser. No. 60/423,616 filed Nov. 4, 2002 and application Ser. No. 60/482,952 filed Jun. 27, 2003, which is incorporated herein by reference.

TECHNICAL FIELD OF THE INVENTION

The present invention relates generally: to digital video broadcast and, more particularly, backwards compatible enhanced digital video broadcast.

BACKGROUND OF THE INVENTION

Various proposals have been made for backwards-compatible enhancements to the vestigial sideband (VSB) modulation digital video broadcast standards promulgated by the Advanced Television Standards Committee (ATSC). One such proposal allows transmission of robustly coded information multiplexed with standard VSB information. FIG. 4 is a simplified high-level block diagram of the proposed system. The transmission system 400 includes data inputs 401a and 401b receiving the normal and robust data, respectively. The received normal and robust data are switched by multiplexer 402 under the control of control unit 403 based on a field sync signal, then randomized by a conventional VSB data randomizer 404. The randomized data stream is then Reed-Solomon coded by coder 405, and the coded data is processed into packets and interleaved by packet formatter 406 and interleaver 407, after which the interleaved data is trellis coded by encoder 408, also controlled by control unit 403.

A parity byte generator 409 operates in conjunction with trellis encoder 408 to generate parity data for interleaver 407. The encoded data from trellis encoder 408 is switched by multiplexer 410 with field sync and segment sync signals received on synchronization inputs 411a and 411b, respectively. The resulting data is combined with a pilot signal, modulated and up-converted by signal transmission module 412 and transmitted from antenna 413 over the satellite or terrestrial transmission channel.

System 400 requires adaptation of the encoder at the transmitter side. If the enhancements proposed could be implemented on the studio side, the encoder at the transmitter side could remain an existing VSB encoder, with only minor changes. There is, therefore, a need in the art for enhancing VSB transmission systems to allow multiplexing of standard and robust data while utilizing an existing encoder on the transmitter side.

SUMMARY OF THE INVENTION

To address the above-discussed deficiencies of the prior art, it is a primary object of the present invention to provide, for use in a wireless digital video broadcast or other transmission system, enhancements allowing multiplexing of normal and robust data using vestigial sideband modulation that are implemented as an enhanced vestigial sideband encoder on the studio side and a standard vestigial sideband modulator at the transmitter. The enhanced encoder conventionally processes multiplexed data into encoded packets, with backwards compatible parity data supplied for normal data, then deinterleaves the processed data, removes a trailing portion from each packet, and derandomizes the remainder before forwarding the processed encoded data as MPEG compliant packets to the standard modulator for VSB modulation and transmission. Other technical advantages will be readily apparent to one skilled in the art from the following figures, description, and claims.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
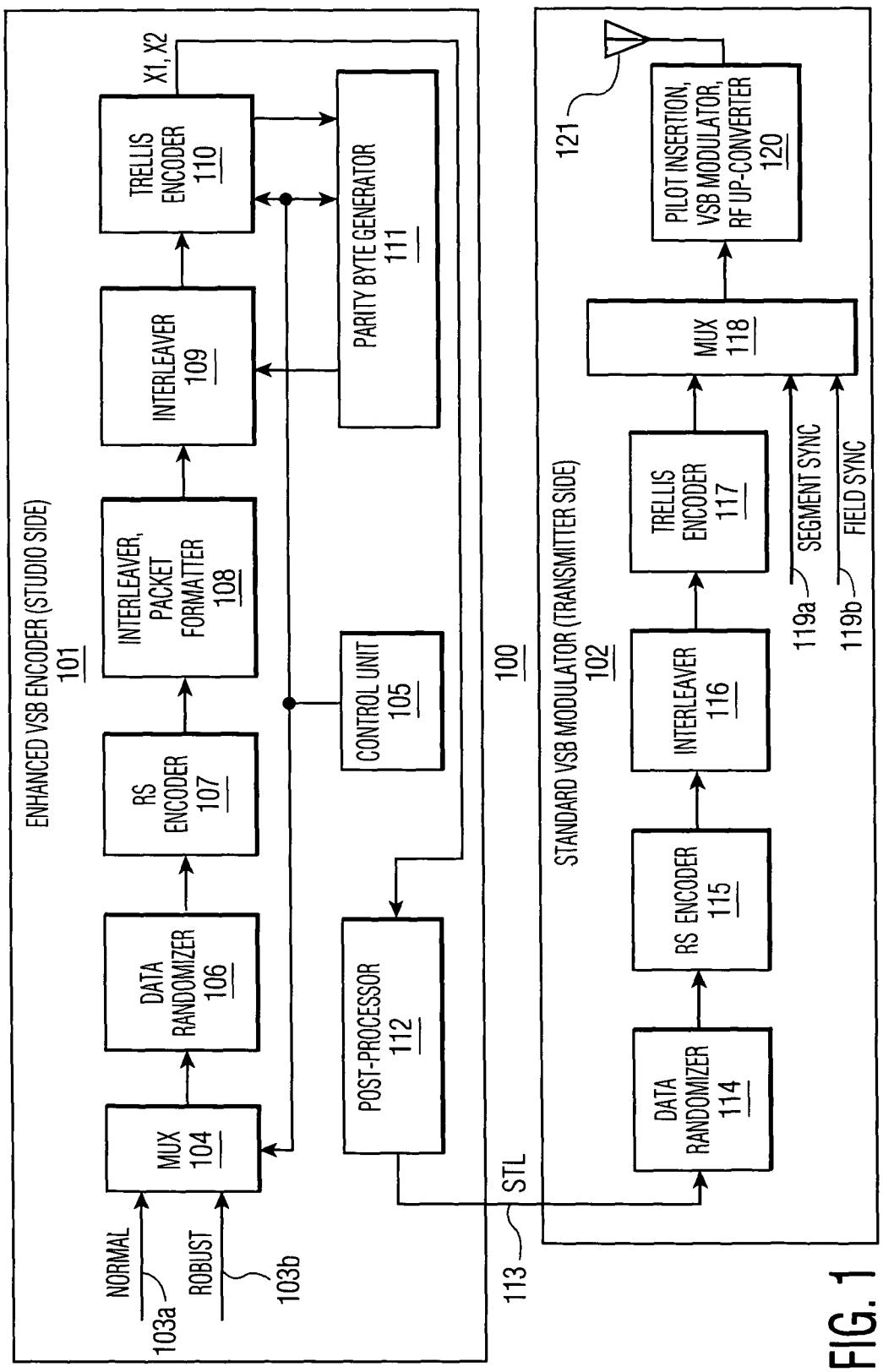
FIG. 1 a system for enhanced vestigial sideband transmission according to one embodiment of the present invention.
Figure 2:
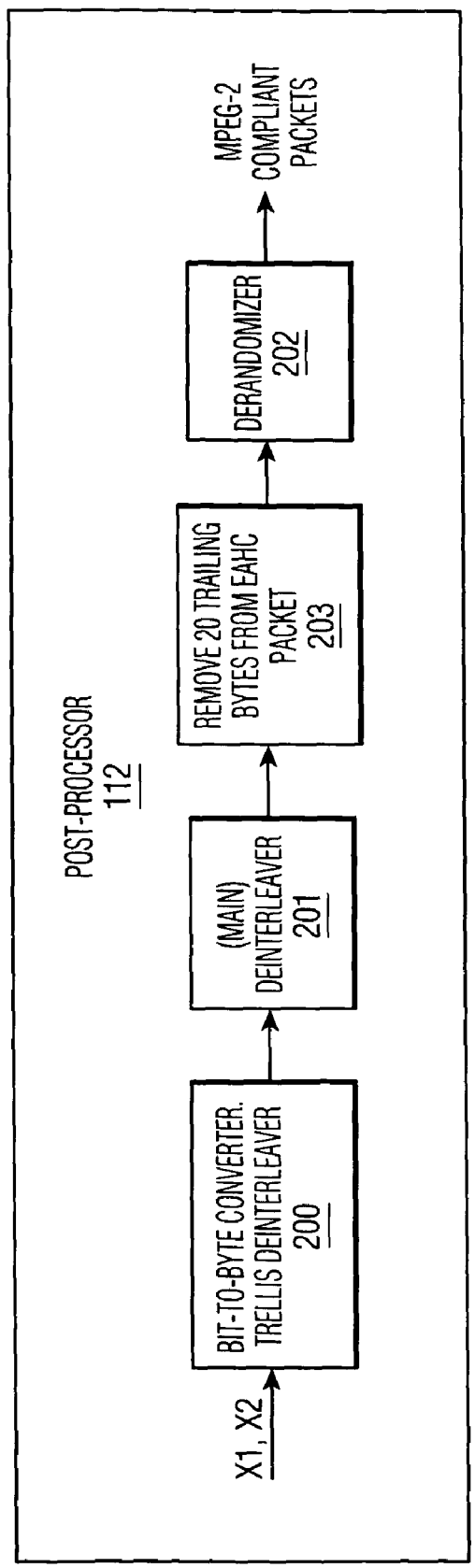
FIG. 2 depicts in greater detail a post-processor for use in enhanced vestigial sideband transmission according to one embodiment of the present invention.
Figure 3:
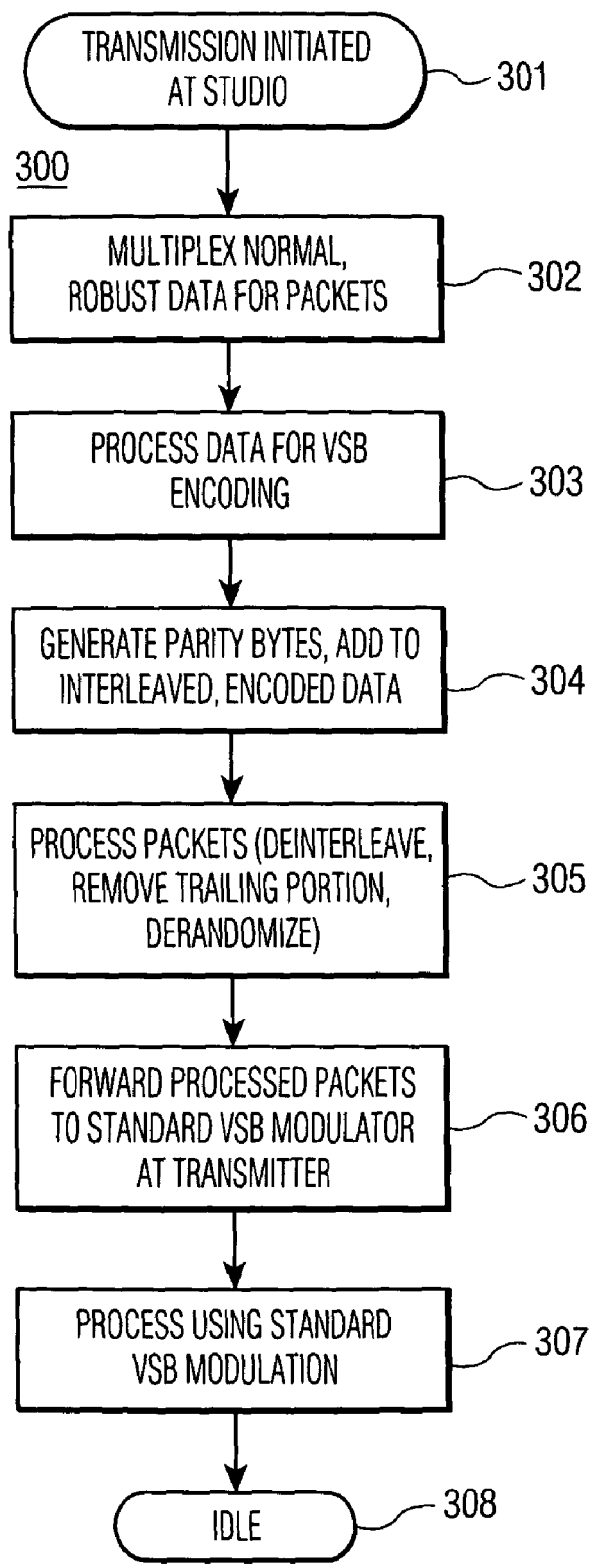
FIG. 3 is a high level flowchart illustrating a process of backwards compatible multiplexed normal and robust digital video data processing for transmission using a standard vestigial sideband modulator according to one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts a system for enhanced vestigial sideband transmission according to one embodiment of the present invention. Transmission system 100 includes two basic components: an enhanced VSB encoder 101 and a standard VSB encoder/modulator 102. The enhanced VSB encoder 101, which is implemented on the studio side, includes data inputs 103a and 103b receiving the normal and robust data, respectively. The received normal and robust data are switched by multiplexer 104 under the control of control unit 105 based on the field sync signal, then randomized by data randomizer

106. The randomized data stream is then Reed-Solomon (RS) coded by RS encoder 107, and the coded data is processed into packets and interleaved by packet formatter 108 and interleaver 109. The interleaved data is trellis coded by encoder 110, also controlled by control unit 105. Parity byte generator 111 operates in conjunction with trellis encoder 110 to generate parity information for use by interleaver 109.

Transmission system 100 includes a post-processor 112 receiving the trellis coded data for further processing as described in further detail below. The output of post-processor 112 is Motion Pictures Expert Group (MPEG) compliant packets transmitted at approximately 19.3 mega-bits per second (Mb/s) over any convenient link 113, such as a Studio-to-Transmitter Link (STL), to standard VSB encoder 102 implemented at the transmitter.

Within standard VSB encoder 102, received packets are sequentially processed by data randomizer 114, RS encoder 115, interleaver 116, and trellis encoder 117. The trellis-encoded data is switched by multiplexer 118 with the field sync and segment sync signals received on synchronization inputs 119*a* and 119*b*, respectively, with the resulting multiplexed data combined with a pilot signal, modulated, and up-converted to the radio frequency (RF) by signal transmission module 120 and then transmitted from antenna 121 over a wireless communications channel to a receiver (not shown).

Figure 4:
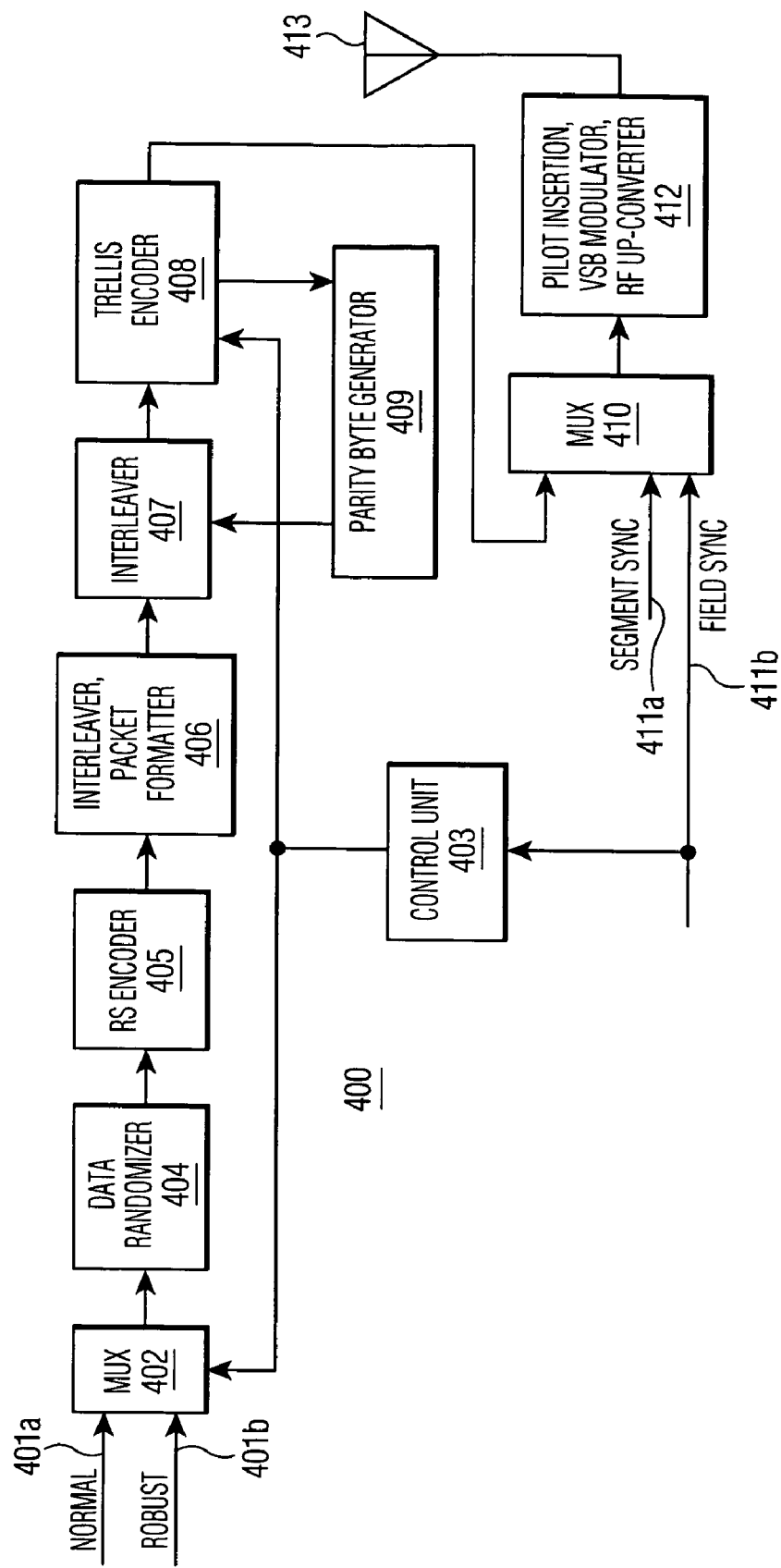
FIG. 4 depicts a proposed enhancement to vestigial sideband decoding permitting multiplexing normal and robust data.

The processing from multiplexer 104 through trellis encoder 110 in transmission system 100 is identical to the corresponding processing performed in system 400 of FIG. 4. Similarly, the processing performed by standard VSB encoder/modulator 102 is identical to conventional processing performed in accordance with the ATSC VSB standard. However, minor modification of the overall processing is required. Specifically, the trellis encoders 110 and 117, the data randomizer 114 within the standard VSB encoder 102, and the main interleaver 109 and 116 in both encoders 101 and 102 need to be synchronized. In addition, parameter signaling data needs to be inserted in the reserved bits of the field sync signal, and the parameter bits and synchronization information need to be transmitted from the studio to the transmitter via some convenient link.

FIG. 2 depicts in greater detail a post-processor for use in enhanced vestigial sideband transmission according to one embodiment of the present invention. Post-processor 112 converts trellis encoded data into MPEG-2 compliant packets on the studio side. Post-processor 112, receives the bit X1, X2 output by trellis encoder 110 with the enhanced VSB encoder 101. The processing performed by post-processor 112 is similar to the forward error correction (FEC) or backend portion of a standard VSB decoder, with some modification. Specifically, the post-processor 112 does not include a trellis decoder or Reed Solomon decoder. However, post-processor 112 includes all remaining blocks of a standard VSB decoder, including a bit-to-byte converter and trellis deinterleaver 200 converting the output bits X1, X2 from trellis encoder 110 into bytes and deinterleaving and a (main) deinterleaver 201 performing standard deinterleaving on the data stream, as well as a de-randomizer 202.

The output of deinterleaver 201 contains 207 bytes per packet. Accordingly, unit 203 within post-processor 112 removes the 20 trailing bytes of each packet to obtain 187 bytes. For the normal data stream packets, the 20 removed bytes correspond to Reed Solomon parity bytes. For the robust data stream packets, the 20 removed bytes contain actual encoded data. However, the removed 20 bytes of the encoded robust data stream packets is recovered by the Reed Solomon encoder on the transmitter side.

The 187 byte packets are de-randomized by a standard de-randomizer 202. Before transmission, an MPEG sync byte may be inserted to obtain 188 byte packets, using synchronization identical to that with a standard VSB backend unit.

FIG. 3 is a high level flowchart illustrating a process of backwards compatible multiplexed normal and robust digital video data processing for transmission using a standard vestigial sideband modulator according to one embodiment of the present invention. The process 300 begins with initiation of multiplexed normal and robust digital video data transmission (step 301) utilizing an enhanced VSB encoder implemented at a studio. Normal and robust digital video data is multiplexed (step 302), alternately switching (from optional buffers) sufficient quantities of each type of data for formation of an MPEG-2 compliant packet so that alternate packets contain normal digital video data with intervening packets containing robust digital video data. Other patterns of packets may also be employed (e.g., every third packet contains robust data, etc.).

The switched data is processed according to conventional VSB encoding (step 303), including randomizing, Reed Solomon encoding, interleaving and packet formatting, trellis interleaving and trellis encoding the data. Parity data is generated and inserted in packets containing normal digital video data (step 304) for backwards compatibility. The packets containing encoded digital video data are then processed in preparation for transmission using a standard VSB modulator (step 305). Such processing includes: bit-to-byte conversion and trellis deinterleaving; "main" deinterleaving; removal of a trailing portion of each packet sufficient to form an MPEG compliant packet (i.e., removing 20 bytes in the exemplary embodiment, to form a 188 byte packet after insertion of a sync byte); and derandomizing. As noted above, the bytes removed are parity in packets containing normal data and encoded digital video information (recovered by the Reed Solomon encoder on the transmitter side) in packets containing robust data. In addition, parameter signaling bits are inserted in the reserved bits of the field sync and MPEG sync bytes are inserted in the packets.

The processed packets are then forwarded to a standard VSB modulator implemented at a transmitter (step 306), and processed according to standard VSB modulation (step 307), including randomizing, Reed Solomon encoding (which recovers the robust data removed from each packet), interleaving and trellis encoding, then pilot insertion, VSB modulation and RF up-conversion. The process of steps 302-307 continues repetitively as long as digital video data remains to be transmitted, then becomes idle (step 308) when all normal and robust data has been transmitted.

The present invention allows normal and robust data to be multiplexed for backwards-compatible concurrent VSB transmission while implementing the enhancements at the studio (e.g. for a network news or other broadcast program) so that a standard VSB modulator at the transmitter (e.g., for a network affiliate station).

It is important to note that while the present invention has been described in the context of a fully functional system, those skilled in the art will appreciate that at least portions of the mechanism of the present invention are capable of being distributed in the form of a machine usable medium containing instructions in a variety of forms, and that the present invention applies equally regardless of the particular type of signal bearing medium utilized to actually carry out the distribution. Examples of machine usable mediums include: nonvolatile, hard-coded type mediums such as read only memories (ROMs) or erasable, electrically programmable read only memories (EEPROMs), recordable type mediums such as floppy disks, hard disk drives and compact disc read only memories (CD-ROMs) or digital versatile discs (DVDs), and transmission type mediums such as digital and analog communication links and frames or packets.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

The invention claimed is:

1. A system for multiplexed transmission of normal and robust digital video data, comprising:
    a multiplexer switching between normal and robust data inputs;
    one or more units configured to randomize, format, interleave and encode data output from the multiplexer into first encoded data packets associated with the normal data input and second encoded packets associated with the robust data input; and
    a post-processing unit configured to deinterleave the first and second encoded data packets produced by the one or more units, further comprising the steps of:
        (a) removing a trailing portion from each of said first and second encoded data packets, and
        (b) derandomizing a remaining portion of each of said first and second encoded data packets,
    wherein said step of removing the trailing portion from each of said first and second encoded data packets includes one of:
        removing reed-solomon parity bytes from said first encoded data packets, and
        removing encoded digital information bytes from said second encoded data packets,
    wherein said reed-solomon parity bytes are different from said encoded digital information bytes.

2. The system according to claim 1, wherein the multiplexer, the one or more units, and the post processing unit form a portion of an enhanced vestigial sideband (VSB) encoder, the one or more units further comprising a data randomizer, a Reed Solomon encoder, an interleaver and packet formatter, a main interleaver and a trellis encoder each operating in sequence on data from the multiplexer to generate the encoded data packets.

3. The system according to claim 2, further comprising: a parity byte generator operating in conjunction with the trellis encoder to generate parity bytes for normal data switched by the multiplexer.

4. The system according to claim 1, wherein the post processing unit removes the trailing portion equal to a number of bytes required to form Motion Picture Expert Group (MPEG) compliant packets.

5. The system according to claim 1, wherein the post processing unit further comprises:
    a bit-to-byte converter and trellis deinterleaver and a main deinterleaver operating sequentially on data packets received from the one or more units; and
    a derandomizer operating on data packets after removal of the trailing portion.

6. The system according to claim 2, wherein the post processing unit forwards packets generated by the enhanced vestigial sideband encoder to a standard vestigial sideband modulator.

7. The system according to claim 6, wherein the standard vestigial sideband modulator further comprises:
    a data randomizer, a Reed Solomon encoder, an interleaver and a trellis encoder operating sequentially on data packets received from the enhanced vestigial sideband encoder;
    a multiplexer switching data packets generated by the standard vestigial sideband modulator with synchronization signals; and
    an antenna transmitting signals corresponding to the switched data packets and synchronization signals.

8. A wireless transmission system including the system according to claim 7, the wireless transmitter further comprising: a data link coupling the enhanced vestigial sideband encoder and the standard vestigial sideband modulator, wherein the antenna transmits the signals over a wireless communications channel to a receiver.

9. The wireless transmission system according to claim 8, wherein the enhanced vestigial sideband encoder is implemented within a studio and the standard vestigial sideband modulator is implemented with a transmitter.

10. The system of claim 1, wherein the encoded digital information bytes removed from the encoded data packets include encoded digital video data.

11. A method of employing a transmission system to perform multiplexed transmission of normal and robust digital video data, comprising:
    switching between normal and robust data inputs via a multiplexer of the transmission system;
    randomizing, formatting, interleaving and encoding data from the normal and robust data inputs into encoded first data packets associated with the normal data input and second data packets associated with the robust data input, via a data randomizer, a packet formatter, an interleaver and an encoder of the transmission system; and
    processing the encoded first and second data packets by deinterleaving the encoded data packets via a post-processor of the transmission system, including the steps of:
        (a) removing a trailing portion from each of said first and second encoded data packets, and
        (b) derandomizing a remaining portion of each of said first and second encoded data packets via the post processor of the transmission system,
    wherein said step of removing the trailing portion from each of said first and second encoded data packets includes one of:
        removing reed-solomon parity bytes from said first encoded data packets, and when an encoded packet includes normal data supplied from the normal data input,
        removing encoded digital information bytes from said second encoded data packets
    wherein said reed-solomon parity bytes are different from said encoded digital information bytes.

12. The method of claim 11, wherein the encoded digital information removed from the encoded data packets includes encoded digital video data.

13. The method according to claim 11, wherein the switching, randomizing and processing are performed within a portion of an enhanced vestigial sideband (VSB) encoder including the data randomizer, a Reed Solomon encoder, the interleaver and the packet formatter, a main interleaver and a trellis encoder each operating in sequence on data from the normal and robust data inputs to generate the encoded data packets.

14. The method according to claim 13, further comprising:
    generating parity bytes for normal data switched from the normal data inputs via a parity byte generator of the transmission system.

15. The method according to claim 11, further comprising:
removing the trailing portion equal to a number of bytes required to form Motion Picture Expert Group (MPEG) compliant packets via the post-processor of the transmission system.

16. The method according to claim 11, wherein processing the encoded data packets comprises:
bit-to-byte converting and trellis deinterleaving the encoded data packets via the post-processor of the transmission system; and
derandomizing the encoded data packets after removal of the trailing portion via the post-processor of the transmission system.

17. The method according to claim 13, further comprising:
forwarding packets generated by the enhanced vestigial sideband encoder to a standard vestigial sideband modulator.

18. The method according to claim 17, further comprising:
randomizing, Reed Solomon encoding, interleaving and trellis encoding data packets received at the standard vestigial sideband modulator from the enhanced vestigial sideband encoder;
switching data packets generated by the standard vestigial sideband modulator with synchronization signals; and
transmitting signals corresponding to the switched data packets and synchronization signals.

19. A system for multiplexed transmission of normal and robust digital video data, comprising:
(I) an enhanced vestigial sideband (VSB) encoder having normal and robust data inputs and including:
a multiplexer switching between the normal and robust data inputs;
a data randomizer, a Reed Solomon encoder, an interleaver and packet formatter, a main interleaver and a trellis encoder each operating in sequence on data from the multiplexer to randomize, format, interleave and encode data from the multiplexer and generate the first encoded data packets associated with the normal data input and second encoded data packets associated with the robust data input; and
a post-processing unit configured to deinterleave the first and second encoded data packets produced by the data randomizer, Reed Solomon encoder, interleaver and packet formatter, main interleaver and trellis encoder, wherein said deinterleaving comprises:
(a) removing a trailing portion from each of said first and second encoded data packets, and
(b) derandomizing a remaining portion of each of said first and second encoded data packets,
wherein said step of removing the trailing portion from each of said first and second encoded data packets includes one of:
(i) removing reed-solomon parity bytes from said first encoded data packets,
(ii) removing encoded digital information bytes from said second encoded data packets,
wherein said reed-solomon parity bytes are different from said encoded digital information bytes,
(II) a standard vestigial sideband modulator receiving data packets from the enhanced vestigial sideband encoder and including:
a data randomizer, a Reed Solomon encoder, an interleaver and a trellis encoder operating sequentially on data packets received from the enhanced vestigial sideband encoder;
a multiplexer switching data packets generated by the data randomizer, Reed Solomon encoder, interleaver and trellis encoder with synchronization signals; and
an antenna transmitting signals corresponding to the switched data packets and synchronization signals.

20. The system according to claim 19, wherein the enhanced vestigial sideband encoder is implemented within a studio and the standard vestigial sideband modulator is implemented with a transmitter.

* * * * *